United States Patent
Tschanz et al.

(10) Patent No.: US 7,409,631 B2
(45) Date of Patent: Aug. 5, 2008

(54) ERROR-DETECTION FLIP-FLOP

(75) Inventors: James Tschanz, Portland, OR (US);
Subhasish Mitra, Folsom, CA (US);
Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 11/323,675

(22) Filed: Dec. 30, 2005

(65) Prior Publication Data

US 2007/0168848 A1    Jul. 19, 2007

(51) Int. Cl.
*G06F 11/00* (2006.01)
*G01R 31/28* (2006.01)

(52) U.S. Cl. .................. 714/798; 714/724; 714/735

(58) Field of Classification Search ............. 714/718, 714/719, 726, 735–736, 798, 699, 700, 819; 365/200, 201; 326/16; 327/211
See application file for complete search history.

(56) References Cited

U.S. PATENT DOCUMENTS

| | | | |
|---|---|---|---|
| 4,680,648 A * | 7/1987 | Takayama | 386/79 |
| 5,606,567 A * | 2/1997 | Agrawal et al. | 714/732 |
| 6,489,825 B1 * | 12/2002 | Pasqualini | 327/211 |
| 6,563,350 B1 * | 5/2003 | Warner et al. | 327/107 |
| 6,680,622 B2 * | 1/2004 | Zounes | 326/16 |
| 6,778,456 B2 * | 8/2004 | Kim | 365/222 |
| 6,788,122 B2 * | 9/2004 | Jones, Jr. | 327/202 |
| 6,986,089 B2 * | 1/2006 | Hill et al. | 714/726 |
| 7,240,253 B2 * | 7/2007 | Yoshida et al. | 714/718 |

OTHER PUBLICATIONS

Razor: A Low-Power Pipeline Based on Circuit-Level Timing Speculation, 2003, Dam Ernst, et al., IEEE pp. 1-13.

* cited by examiner

*Primary Examiner*—Phung M Chung
(74) *Attorney, Agent, or Firm*—Carrie A. Boone, P.C.

(57) ABSTRACT

An error-detection flip-flop is disclosed for identifying timing errors in digital circuits. The error-detection flip-flop is a master-slave flip-flop including logic to determine whether an input signal is received during a predetermined clock period, signifying a timing error. The error-detection flip-flop produces a variable-length error pulse, which may be combined with other error pulses and converted to a stable signal for sampling by error-correction circuitry. The error-detection flip-flop does not increase the clocking power of the digital circuit and consumes little additional circuit area.

9 Claims, 11 Drawing Sheets

ERROR-DETECTION FLIP-FLOP

TECHNICAL FIELD

The application relates to timing errors in digital circuits and, more particularly, to error detection circuitry for digital circuits.

BACKGROUND

Digital circuits include circuit elements whose input signals are synchronized using one or more clocks. Between these synchronizing elements may be multiple stages of logic that perform the desired computation. The propagation delay of a signal through this logic must meet certain requirements such that the synchronizing elements are able to capture the correct data at the intended clock stage, e.g., the rising or falling edge of the clock. If, for some reason, the signal is delayed through this logic and does not arrive at the synchronizing element by the required time period, a timing error may result, which may impair operation of the digital circuit.

Where the delay is known, the digital circuit may be designed to incorporate the delay. There are many variations, both static and dynamic, however, which cause delays to change in digital circuits. A process variation may result from the fabrication of the circuit. This static variation may affects the speed at which the circuit operates. Dynamic variations, such as reliability degradation, voltage and temperature fluctuations, and delay push-out due to crosstalk or noise, may be more difficult to predict and account for in a circuit design.

Typically, variations that cause delays in digital circuits are managed by "margining" the circuit, or changing its operating environment so as to avoid the delay condition. As one example, the clock frequency of the circuit may be sufficiently reduced so that the circuit works even under the worst-case variations. Even where the delay variation, such as a voltage droop, is infrequent, the slower clock rate ensures that the digital circuit does not experience a timing error. Another method of margining the circuit may be to increase the voltage supplied to the circuit.

Margining is undesirable because the full benefit of the original circuit design, in terms of power efficiency and speed, is not realized. Furthermore, margining does not always work. As variations increase, the margins are increasing as well, resulting in lower performance or higher power demands. In some circumstances, the variations may be difficult to accurately predict.

Another technique for addressing timing errors may be to operate the digital circuit according to its original design specifications and detect the worst-case condition. Thus, for example, the digital circuit may be maintained at a higher, "non-safe" frequency, that is, vulnerable to variations, but may include additional circuitry to detect the delay variation. Various methods have been proposed for detecting timing errors in digital circuits. One technique employs double-sampling flip-flops to detect when an input signal to the flip-flop arrives late, causing an error. If the later sampling does not match the original sampling, the data has arrived too late to be captured by the flip-flop, and an error is signaled. The error may then be handled by stalling the pipeline of the signal path and re-initiating the signal, for example. The double-sampling technique involves a large amount of overhead in terms of clocking power and circuit area.

Thus, there is a continuing need to provide a method and a system for detecting timing errors in a digital circuit that overcomes the shortcomings of the prior art.

BRIEF DESCRIPTION OF THE DRAWINGS

The foregoing aspects and many of the attendant advantages of this subject matter will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, an error-detection flip-flop is disclosed for identifying timing errors in digital circuits. The error-detection flip-flop is a master-slave flip-flop including logic to determine whether an input signal is received during a predetermined portion of a clock period, signifying a timing error. The error-detection flip-flop produces a variable-length error pulse, which may be combined with other error pulses and converted to a stable signal for sampling by error-correction circuitry. Error-detection flip-flops may replace master-slave flip-flops in a digital circuit and yet do not increase the clocking power of the digital circuit and consume little additional circuit area.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Figure 1:
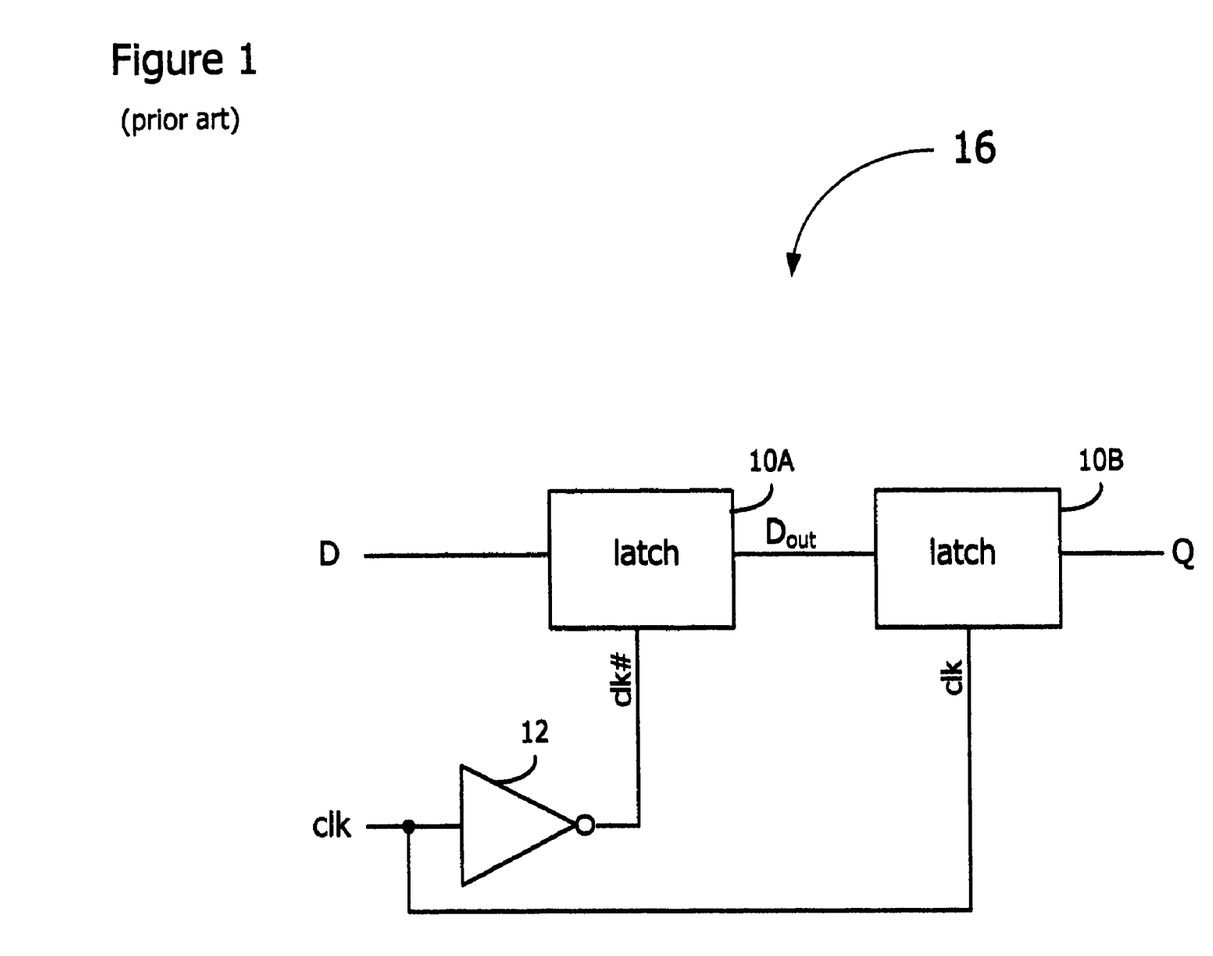
FIG. 1 is a logic diagram of a master-slave flip-flop, according to the prior art.

FIG. 1 is a logic diagram of a master-slave flip-flop 16, according to the prior art. The master-slave flip-flop 16 includes two latches, a master latch 10A and a slave latch 10B. The master latch 10A receives a signal, D, and produces a signal, $D_{out}$ when enabled (allowing the input to be propagated to the output). The slave latch 10B receives the signal, $D_{out}$, and produces a signal, Q when enabled. The signals, D, $D_{out}$, and Q are digital signals, having one of two states, a high, or "1" state, and a low, or "0" state. The master-slave flip-flop 16 may be one of a variety of master-slave flip-flops, not limited to the D-type of flip-flop.

The slave latch 10B is driven by a clock signal, clk, while the master latch 10A is driven by an inverted clock signal, clk#, produced by an inverter 12. The clock signal is typically a square wave oscillating between high and low phases. The clock signal controls when the latches are opened.

The latches 10A and 10B are enabled when the clock signal is in a predetermined stage. In the following example, it is assumed that the master latch 10A is enabled when the clock goes from a high phase to a low phase and the slave latch 10B is enabled when the clock goes from a low phase to a high phase. However, the principles described herein may be applied when the master latch 10A is enabled when the clock transitions from a low phase to a high phase.

Under such a scheme, where the incoming signal, D, is stable during the low phase of the clock, the signal, D, passes through the master latch 10A as signal, $D_{out}$. When the clock subsequently goes high, the signal, $D_{out}$, passes through the slave latch 10B as signal, Q. Thus, in a single clock cycle, the signal passes through the master-slave flip-flop 16.

Where, instead, the incoming data, D, changes after the clock goes to its high phase, then the master latch 10A will not receive the incoming signal, D, but has already latched the previous value of D. Thus, if the incoming data signal to the master-slave flip-flop 16 occurs while the clock is in its high phase, an error condition occurs because the new data is not identified by the master latch. In other words, the incoming data signal, D, is timely when received by the master-slave flip-flop 16 during a low phase of the clock. When received during a high phase of the clock, an error condition exists. This error condition may result in loss of or misinterpretation of the data in other parts of the digital circuit.

Figure 2:
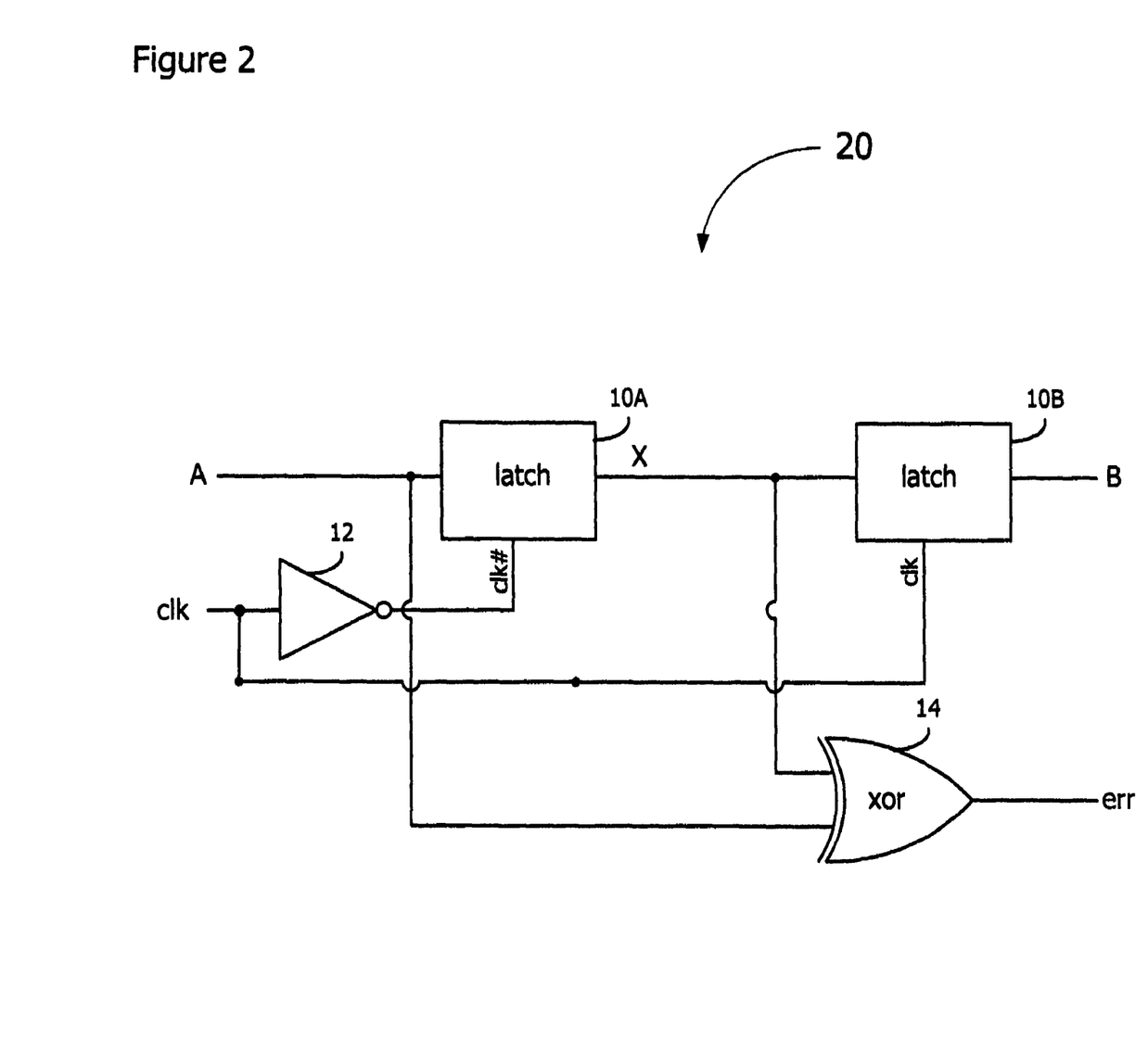
FIG. 2 is a logic diagram of an error-detection flip-flop, according to some embodiments.
Figure 3:
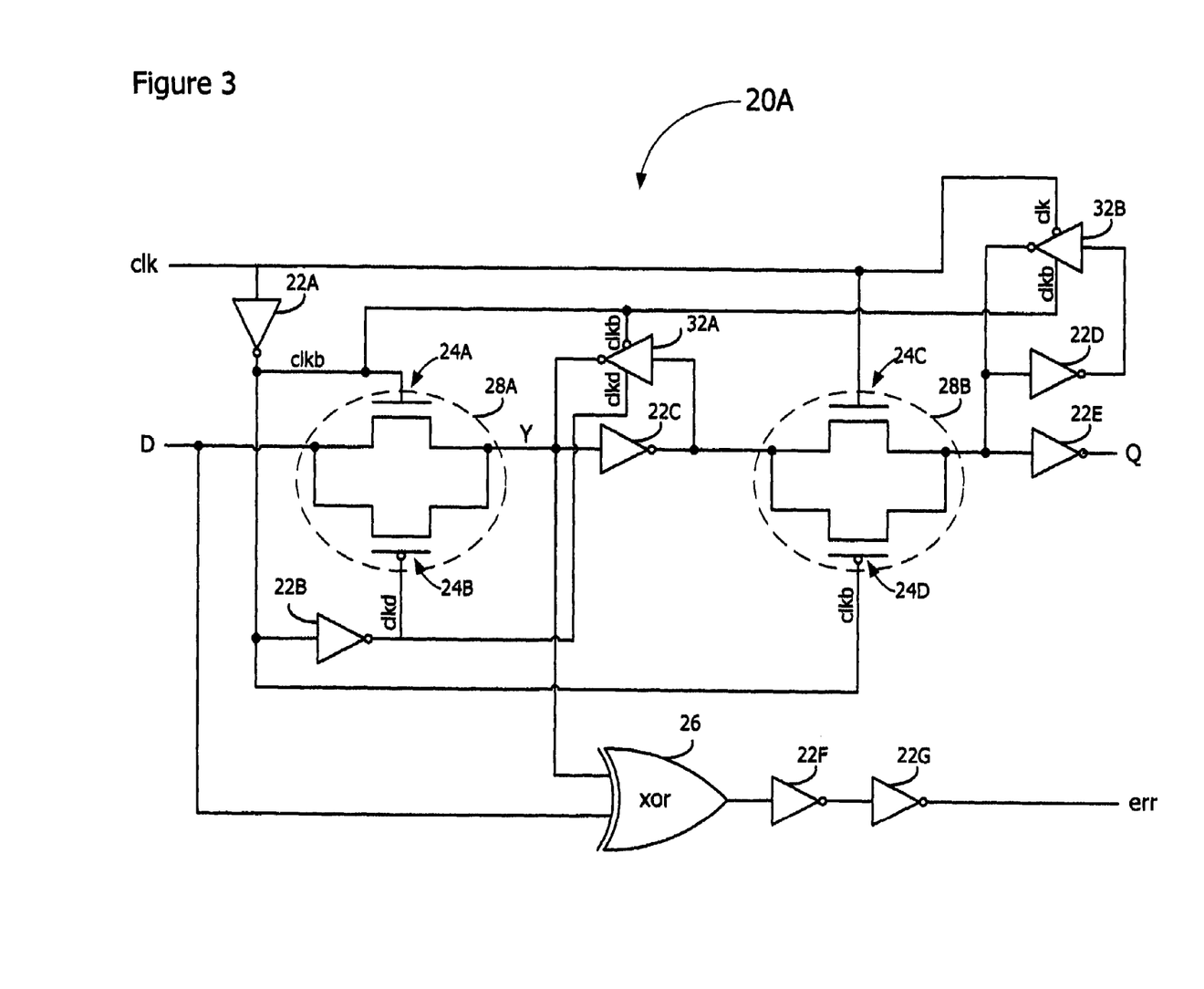
FIG. 3 is a logic diagram of an implementation of the error-detection flip-flop of FIG. 2, according to some embodiments.
Figure 4:
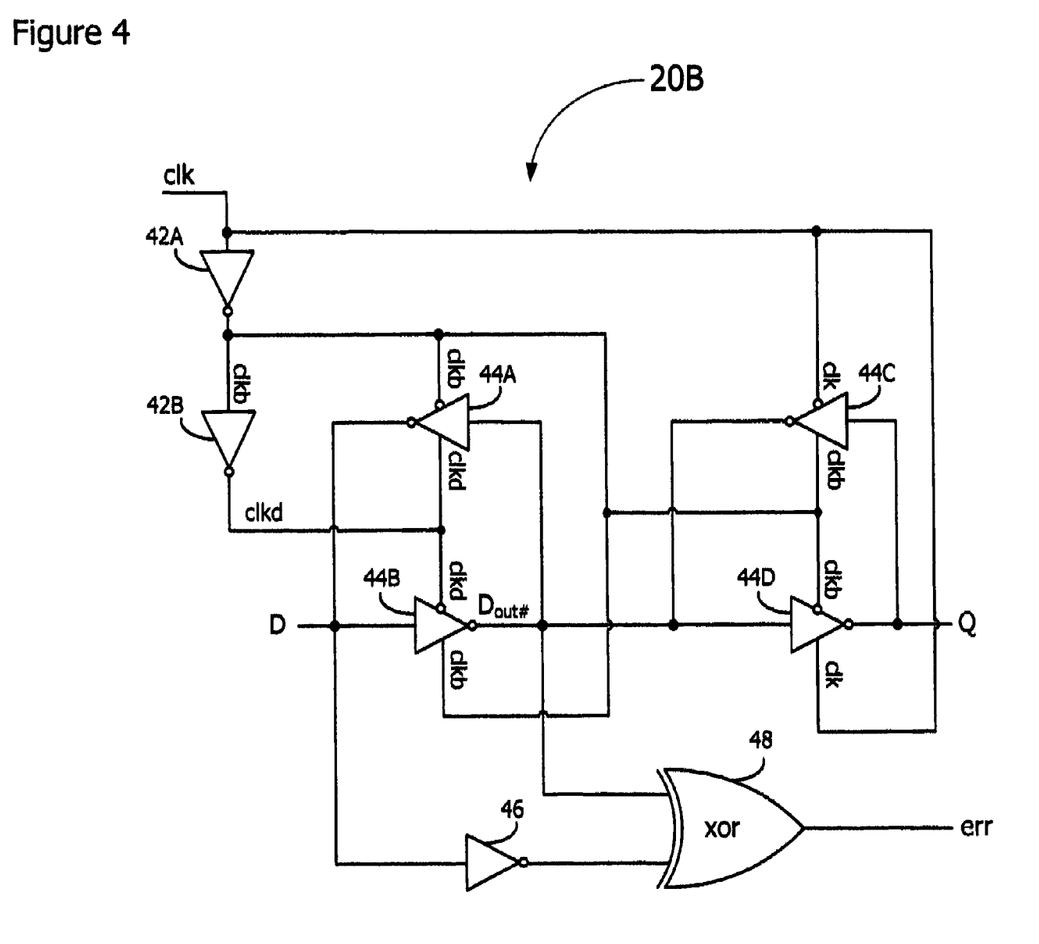
FIG. 4 is a logic diagram of an implementation of the error-detection flip-flop of FIG. 2, according to some embodiments.

FIGS. 2, 3, and 4 are logic diagrams of an error detection flip-flop 20, an error-detection flip-flop 20A, and an error-detection flip-flop 20B (collectively, error-detection flip-flops 20), according to some embodiments. The error-detection flip-flop 20 of FIG. 2 is a generalized representation of a master-slave flip-flop with error detection, while the error-detection flip-flops 20A and 20B are more particular in their circuit representation.

In FIG. 2, according to some embodiments, an error-detection flip-flop 20 is depicted. The error-detection flip-flop 20 is a master-slave flip-flop, as in the prior art circuit 16, including a master latch 10A, a slave latch 10B, and an inverter 12. As with the prior art flip-flop, it is assumed for simplicity that the master latch 10A is enabled when the clock goes from a high phase to a low phase and the slave latch 10B is enabled when the clock goes from a low phase to a high phase.

Additionally, the error-detection flip-flop 20 includes an exclusive-or (XOR) gate 14, which compares an output signal, X, from the master latch 10A, with an incoming signal, A. If the two compared signals are different, an error signal, err, is generated automatically by the error-detection flip-flop 20.

Such a condition would arise when the input signal, A, changes after the clock signal has transitioned to a high phase. If this occurs, the data signal is assumed to be arriving late from the previous clock cycle. The prior value of the signal, A, which arrived in a low phase, is latched through the master latch 10A when the clock goes high. Once the clock is high, the master latch 10A is closed. The new value of the signal, A, in a high phase, is prevented from being latched through the master latch 10A by the already high clock. The error-detection flip-flop 20 thus detects whenever the incoming data to the flip-flop changes when the clock is high (in the first phase of the clock).

FIG. 3 is another error-detection flip-flop 20A, according to some embodiments. The error-detection flip-flop 20A is also a master-slave flip-flop, including a transmission gate 28A in the master stage and a transmission gate 28B in the slave stage. For simplicity, it is assumed that the master stage is enabled when the clock goes from a high phase to a low phase and the slave stage is enabled when the clock goes from a low phase to a high phase.

The transmission gate 28A includes an n-type metal-oxide semiconductor (NMOS) transistor 24A in series with a p-type MOS (PMOS) transistor 24B; inverter 22C and tri-state inverter 32A are part of the master latch. The transmission gate 28B includes an NMOS transistor 24C in series with a PMOS transistor 24D; inverters 22D and 22E and tri-state inverter 32B are part of the slave latch.

A clock signal, clk, is received into the error-detection flip-flop 20A. The clock signal, clk, passes through an inverter 22A and an inverter 22B, resulting in clock signals, clkb and clkd, respectively. The transmission gates are driven by clocks of opposite polarity. For the transmission gate 28A, the NMOS transistor 24A is driven by the clock signal, clkb, while the PMOS transistor 24B is driven by the clock signal, clkd. For the transmission gate 28B, the NMOS transistor 24C is driven by the clock signal, clk, while the PMOS transistor 24D is driven by the clock signal, clkb. For the transmission gate 28A (28B), when the gate voltage of the NMOS transistor 24A (24C) is high and the gate voltage of the PMOS transistor 24B (24D) is low, both transistors are turned on and the incoming signal passes through the transmission gate. For the transmission gate 28A, the signal, D, passes through as the signal, Y. When the gate voltage of the NMOS transistor 24A (24C) is instead low and the gate voltage of the PMOS transistor 28B (24D) is high, both transistors are turned off and no signal passes through the transmission gate 28A (28B).

As with the error detection flip-flop 20 of FIG. 2, the error-detection flip-flop 20A includes an XOR gate 26, which generates an error signal, err, when the output signal from the master latch, Y, is different from the input signal, D. This condition occurs when the input signal, D, changes after the clock signal, clk, has transitioned from low to high, but before the clock signal, clk has transitioned back to the low phase. In other words, when the signal, D, changes while the clock signal, clk, is high, the error signal, err, is produced by the circuit 20A.

Also shown in FIG. 3 are two inverters 22F and 22G coupled to the output of the XOR gate 26. These optional inverters may be used for pulse-shaping the error signal, err.

In FIG. 4, another error-detection flip-flop 20B is depicted, according to some embodiments. The error-detection flip-flop 20B includes four tri-state inverters 44A, 44B, 44C, and 44D, two making up the master latch (44A and 44B) and two making up the slave latch (44C and 44D). Two inverters 42A and 42B, twice invert clock signal, clk, to produce clock signals, clkb and clkd, respectively.

A two-input XOR gate 48 is used to compare the incoming signal, D, with an output signal, $D_{out\#}$, from the master latch. In this circuit 20B, because the output, $D_{out\#}$, is the inverse of the input signal, D, an inverter 46 is coupled to the input signal, D, before entering the XOR circuit 48. When the inverse of the input signal, D, is different from the output signal, $D_{out\#}$, an error signal, err, is produced.

FIGS. 3 and 4 demonstrate two possible implementations 20A and 20B, respectively, of the more generalized error-detection flip-flop 20 shown in FIG. 2. Virtually any master-slave flip-flop within the digital circuit may be modified to include an XOR gate and/or one or more inverters to detect a change in the input signal to the flip-flop during a predetermined portion of the clock cycle, such as after the clock goes high, as illustrated above.

In contrast to prior art solutions for detecting timing errors, the error-detection flip-flops 20 involves smaller area, power, and performance overhead. Where some prior art implementations replicate the entire flip-flop circuit, the error-detection flip-flop 20 includes a single additional XOR gate, in some embodiments, or the XOR gate and one or more inverters, in some embodiments.

Further, neither the XOR gate nor the inverter(s) increase the clocking power of the master-slave flip-flop, since neither circuit element is part of the clocking network of the circuit. For many circuit designs, clocking power is a large percentage of the total power used. The error-detection flip-flops 20 do not increase the clocking power over standard master-slave flip-flops to be replaced. Thus, in contrast to prior art solutions, the use of one or more of the error-detection flip-flops 20 may potentially reduce the margins in the design, thus enabling the digital circuit to operate at a higher average frequency or using less power on average, according to some embodiments.

Figure 5:
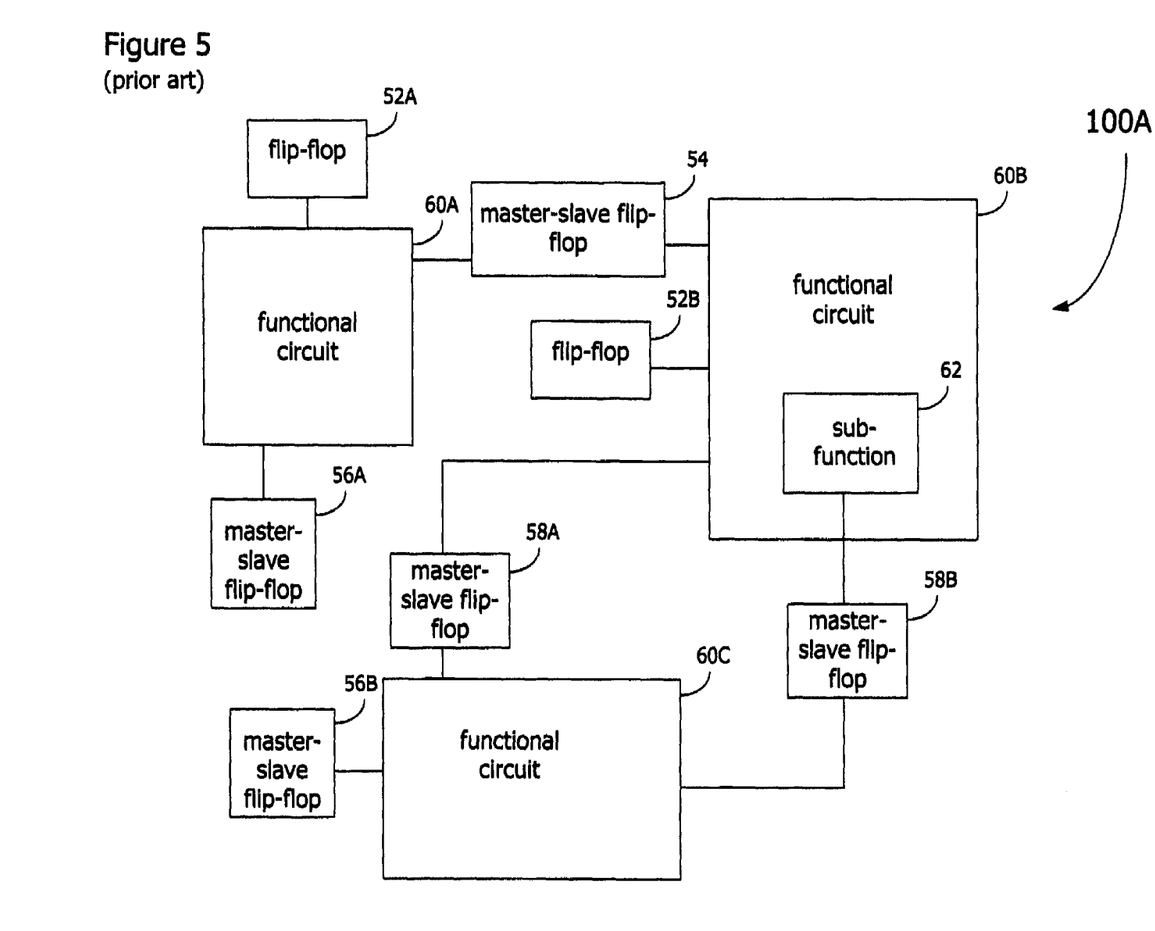
FIG. 5 is block diagram a digital circuit including multiple flip-flops, according to the prior art.

FIG. 5 is a block diagram of a digital circuit 100A, according to the prior art. The digital circuit 100A includes a number of functional circuits 60A, 60B, and 60C, with functional circuit 60B further including a sub-function 62. The digital circuit 100A also includes a number of flip-flops 52A and 52B, which are not the master-slave variety, as well as master-slave flip-flops 54, 56A, 56B, 58A, and 58B. The master-slave flip-flops, which make up part of the digital circuit 100A, are of three distinct types, as indicated by the reference numbers and the shapes of the blocks. Thus, master-slave flip-flops 56A and 56B are of the same type (e.g., J-K master-slave flip-flop) while the master-slave flip-flop 54 is of a different type (e.g., D master-slave flip-flop). Although no clock signals are depicted in the block diagram, some or all of the the circuit elements (functional circuits and flip-flops) are driven by one or more clocks.

As is well-known in circuit design, the flip-flops may be useful for a variety of purposes within the digital circuit. Often, the flip-flops operate as staging logic, to receive a signal and ensure that the signal received into one of the functional circuits 60A, 60B, or 60C conforms to the timing specifications of the circuit. It is not unusual for a digital circuit to include many different types of flip-flops.

Figure 6:
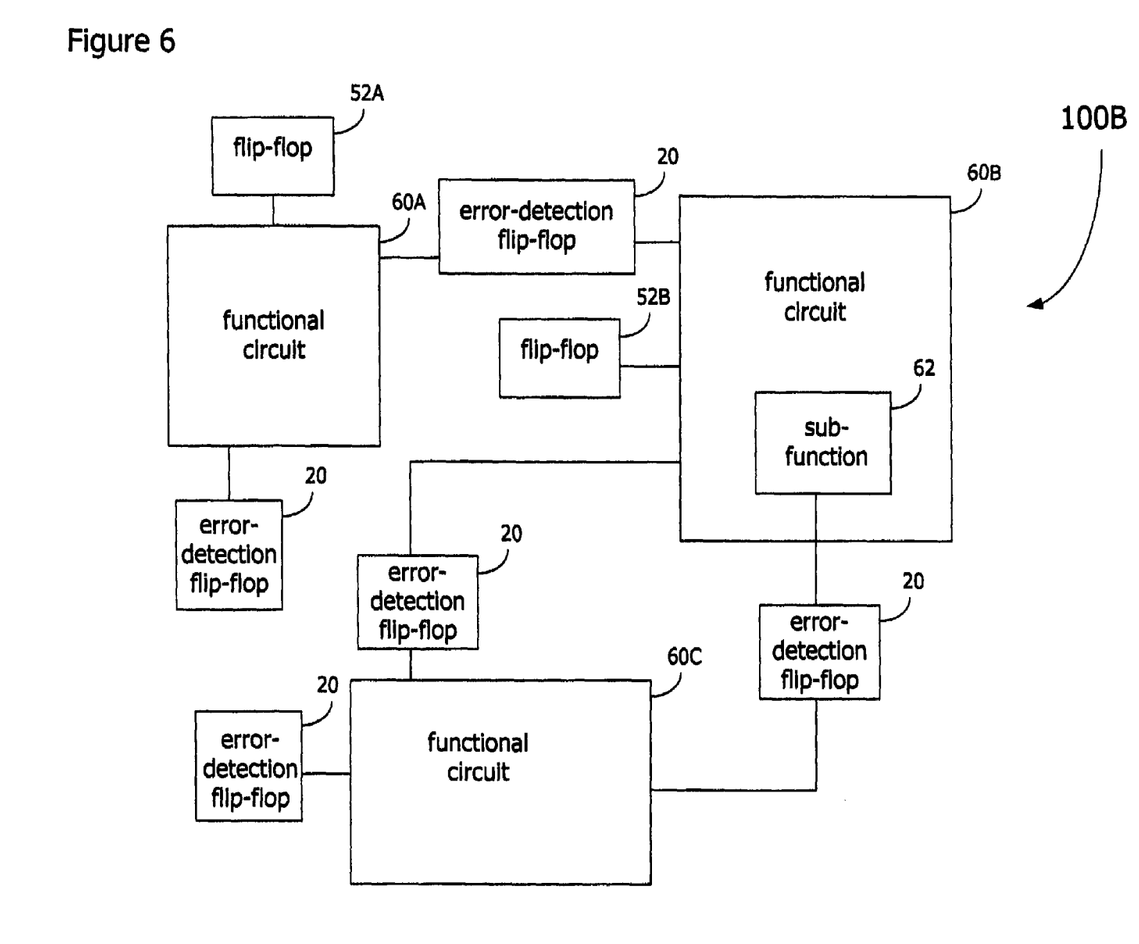
FIG. 6 is a block diagram of the digital circuit of FIG. 5, in which the master-slave flip-flops have been replaced with error-detection flip-flops, according to some embodiments.

Each of the master-slave flip-flops shown in FIG. 5 may be replaced with one of the error-detection flip-flops 20, as is depicted in the digital circuit 100B of FIG. 6, according to some embodiments. The master-slave flip-flops 54, 56A, 56B, 58A, and 58B have all been replaced with an error-detection flip-flop 20 in the digital circuit 100B. It does not matter that the digital circuit includes different types of master-slave flip-flops. Each may be replaced with the error-detection flip-flop. This replacement involves adding an XOR gate and, optionally, inverters. Neither the XOR gate nor the inverters are clocked. Thus, the clocking power of the digital circuit 100A, which has no error-detection logic, and the digital circuit 100B, which includes error-detection logic, are substantially the same. The non-master-slave flip-flops, flip-flops 52A and 52B are not replaced with the error-detection flip-flops 20.

Returning to FIGS. 2, 3, and 4, recall that each of the error-detection flip-flops 20 generate an error signal, err, whenever the input signal, A or D, violates the timing specification, described above. In some embodiments, the error signal, err, is a pulse of variable width. The width of the error signal, err, depends on when the error occurred. For example, if the change in the input signal occurs shortly after the rising edge of the clock signal, the width of the error signal, err, is relatively wide. If the change in the input signal occurs long after the rising edge of the clock signal (but prior to the falling edge), the error signal, err, is relatively narrow.

Figure 7:
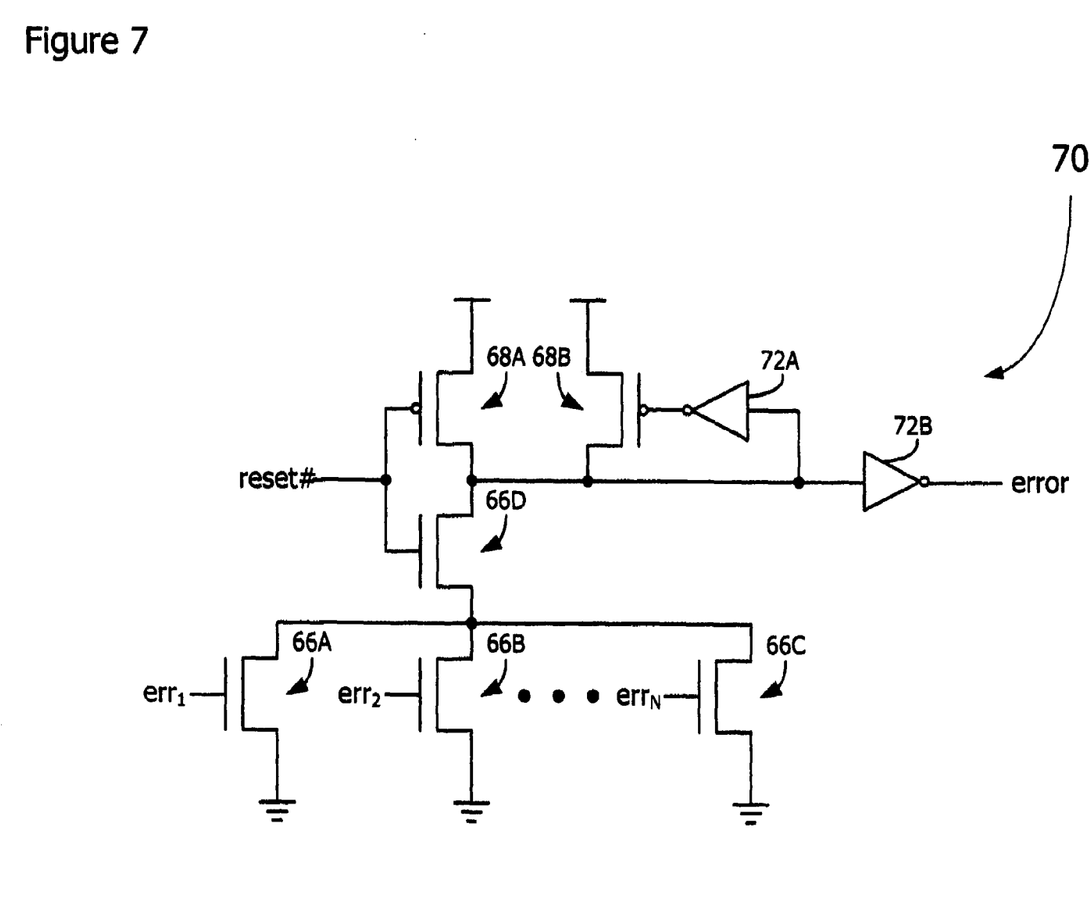
FIG. 7 is a logic diagram of an error latching circuit, according to some embodiments.

Whether wide or narrow in width, an error pulse is not very useful for analysis in a digital circuit. Thus, in some embodiments, the error pulse is converted to a stable error signal that may be analyzed by the digital circuit. In FIG. 7, for example, an error latching circuit 70 is depicted, according to some embodiments, for processing one or more error signals generated by error-detection flip-flops 20, such as in the digital circuit 100B of FIG. 6. The error latching circuit is a dynamic "or" circuit that combines the error pulses from the many different paths within the digital circuit.

The error latching circuit 70 includes NMOS transistors 66A, 66B, 66C, and 66D, PMOS transistors 68A and 68B, and inverters 72A and 72B, for processing up to N error signals simultaneously, for integer N. The gates to the PMOS transistor 68A and the NMOS transistor 66D are pre-charged by a signal, reset#, as the error signal, error, remains in a low state as long as no error occurs. Whenever an error-detection flip-flop 20 detects a timing error, the error signal, $err_1$, $err_2$, ... or $err_N$, is pulsed. This discharges the dynamic gate (66A, 66B, or 66C) and causes the signal, error, to assert. The signal, error, remains high until the reset signal, reset#, is asserted. Thus, each of the error signals, denoted $err_1$, $err_2$, ... $err_N$, are converted to a static error signal, error, that maintains a logic state, such as a high state, for subsequent analysis by error correction circuitry (not shown). The error latching circuit of FIG. 7 is but one of several possible implementations for converting the dynamic, variable-width error signals into a static signal for downstream analysis.

Figure 8:
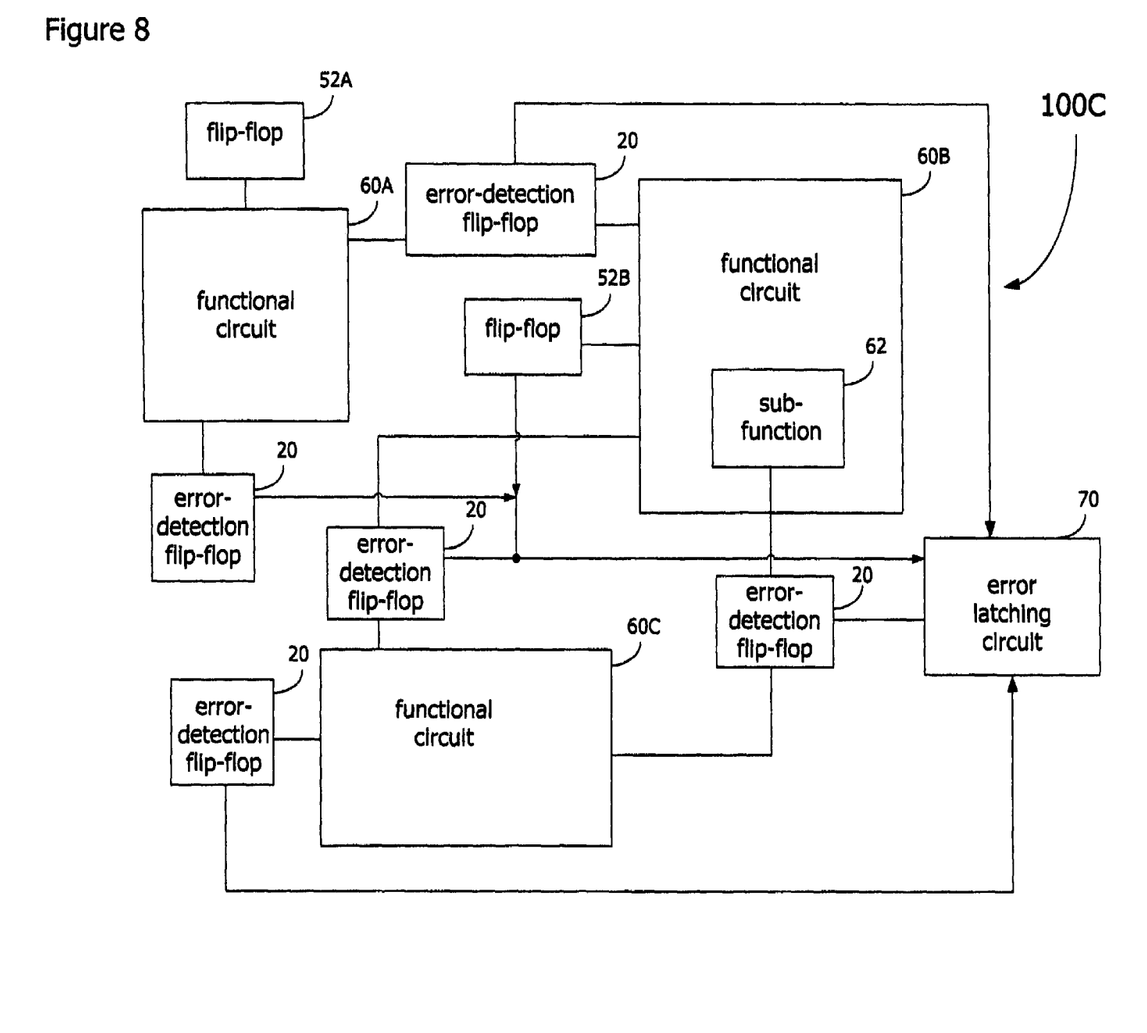
FIG. 8 is a block diagram of the digital circuit of FIG. 6 including the error latching circuit of FIG. 7, according to some embodiments.

FIG. 8 is a block diagram of a digital circuit 100C, which includes the digital circuit 100B (FIG. 6) and the error latching circuit 70 (FIG. 7). Each of the error-detection flip-flops 20 depicted in the block diagram are coupled to the error latching circuit 70 so that the circuit 100C is able to identify static signals denoting error conditions within the circuit.

Figure 9:
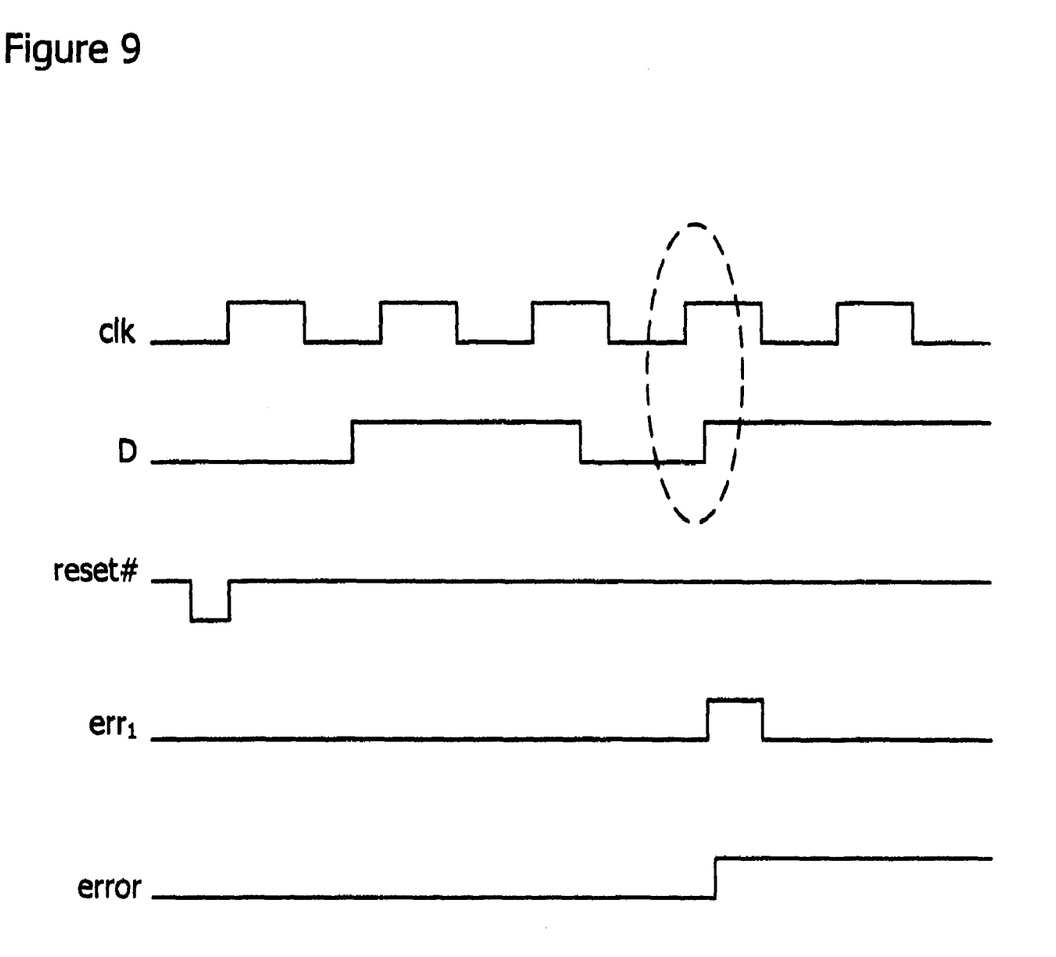
FIG. 9 is a timing diagram showing operation of the error-detection flip-flop of FIG. 3, according to some embodiments.

FIG. 9 is a timing diagram that demonstrates the principles described above. The clock signal, clk, is at the top of the timing diagram. An input signal, D, to the error-detection flip-flop 20 (FIGS. 3 or 4) erroneously goes high following a rising edge of the clock signal (see circled region). The error-detection flip-flop 20 generates an error pulse, err1, which is subsequently converted to the static error signal, error, by the error latching circuit 70 (FIG. 7). The error signal, error, is thus maintained for subsequent analysis by error-correcting circuitry.

While prior art error-detection techniques use a delay element to set the sampling time during which a late-arriving input is detected, in the error-detection flip-flop 20, this time is equal to the high phase of the clock. In other words, for a 50% duty-cycle clock, any input that arrives in the first half of the clock cycle will be flagged as an error. Thus, the delay paths in the design that are characterized as having a very small delay (min-delay) may be tuned to have a delay no less than half the clock cycle. Otherwise, if paths have a delay less than half the clock cycle, the output data from these paths may be incorrectly interpreted as timing errors, since they arrive in the first phase of the clock.

This sampling time may be tuned by changing the duty-cycle of the clock. If the duty cycle is set to 25%, the min-delay constraint may be easier to meet, but the error-detection window will be smaller. Thus, by including a duty-cycle tuning control in the design, it is possible to tune the error-detection window after the digital circuit is manufactured without introducing additional overhead into the circuit.

Dynamic error detection and correction allows resilient circuit operation. The circuit operates correctly even in the presence of variations. The net benefit to the customer is a digital circuit with higher performance or lower power than in the prior art, which uses margins to ensure correct operation. The digital circuit may be a processor, in which high-performance operation is generally part of the design.

Figure 10:
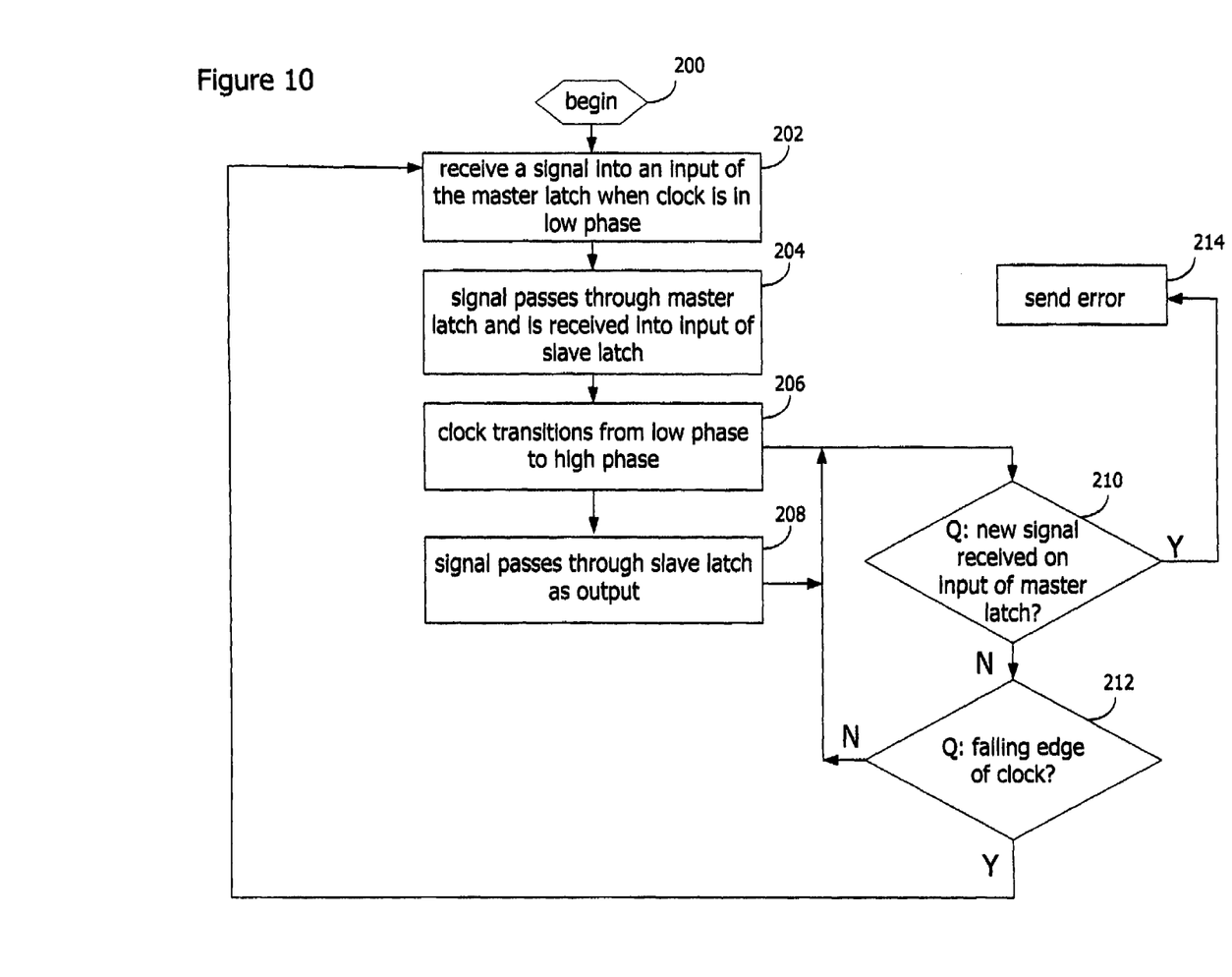
FIG. 10 is a flow diagram showing operation of the error-detection flip-flop of FIGS. 2, 3, or 4, according to some embodiments.

In FIG. 10, a flow diagram 200 is used to illustrate the principles of operation for the error-detection flip-flops 20 of FIGS. 2, 3, or 4. The error-detection flip-flop 20 receives a signal into an input of the master latch when the clock is in its low phase (block 202). The signal passes through the master latch and is received into an input of the slave latch (block 204).

The clock transitions from low phase to high phase (block 206). The signal at the output of the master latch passes through the slave latch to its output (block 208). As explained above, a timing error occurs if a change in the input to the master occurs, following the clock transition. Accordingly, simultaneously with the operation of block 208, the flow diagram 200 inquires whether a new signal has been received on the input of the master latch (block 210). (If the new signal is identical to the prior signal latched through the master latch, this would not be identified by the circuit as a "new" signal.) If a new signal is identified (the "Y" prong of block 210), then an error has occurred and an error signal is generated (block 214). Otherwise, an inquiry is made whether the falling edge of the clock has occurred (block 212). If not, the inquiries are repeated (blocks 210 and 212) until the falling edge of the clock (the "Y" prong of block 212), at which point control proceeds back to block 202. The process 200 may be repeated indefinitely.

Figure 11:
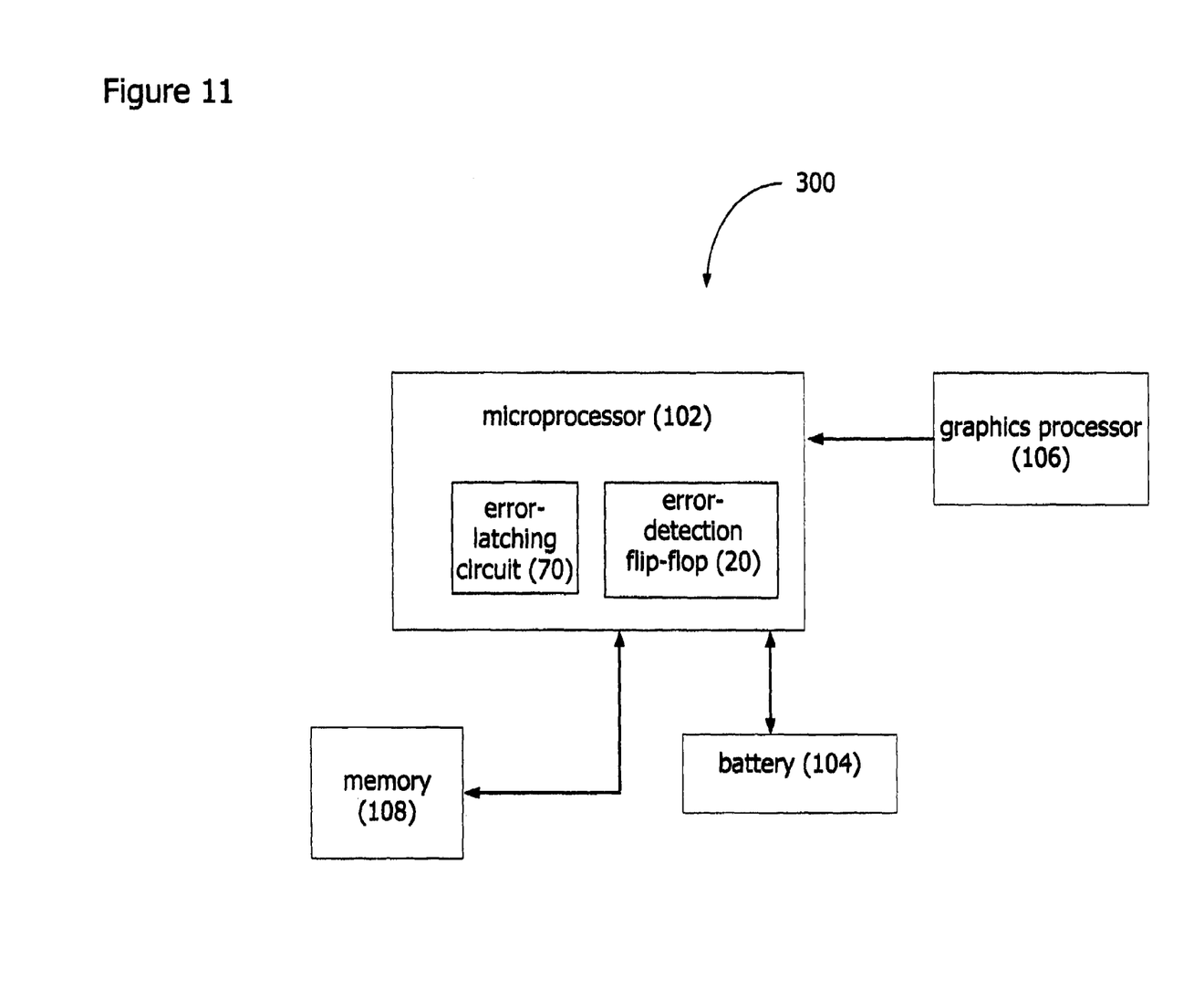
FIG. 11 is a block diagram of a system using the error-detection flip-flop and error latching circuit, according to some embodiments.

In FIG. 11, a system 300 is depicted for implementing the error-detection flip-flop 20, according to some embodiments. The system 300 is a processor-based system, generally comprising a microprocessor 102, which includes one or more error-detection flip-flops 20 (FIGS. 2, 3, or 4), as well as an error latching circuit 70 (FIG. 7). The system 300 also includes a graphics processor 106, a memory 108, and a battery 104.

The microprocessor 102 is coupled to the graphics processor 106, battery 104 and memory 108 using separate point-to-point links. (Alternatively, the microprocessor 102 may be coupled to the devices via a bus interface.) The battery 104 supplies power to the microprocessor 102 during operation of the system 300. The error-detection flip-flop 20 identifies timing errors within the system 300. Error events may periodically be sent to the error-latching circuit 70.

While the subject matter has been described with respect to a limited number of embodiments, those skilled in the art will appreciate numerous modifications and variations therefrom. It is intended that the appended claims cover all such modifications and variations as fall within the true spirit and scope of the subject matter.

We claim:
1. An error-detection circuit, comprising:
a master-slave flip-flop comprising:
a master latch driven by a clock, the master latch to receive a first signal and to generate a second signal when the clock is in a first phase, the master latch further comprising:
a transmission gate comprising a first transistor in parallel with a second transistor;
an inverter coupled to an output of the transmission gate; and
a second inverter, the inverter and the second inverter to form a feedback loop; and
a slave latch driven by the clock, the slave latch to receive the second signal and to generate a third signal when the clock is in a second phase; and
a gate to receive the first signal and the second signal, where in the gate is to generate an error signal when the first signal is different from the second signal.

2. The error-detection circuit of claim 1, the slave latch further comprising a second transmission gate comprising a third transistor in parallel with a fourth transistor.

3. The error-detection circuit of claim 2, the slave latch further comprising a third inverter coupled to an output of the second transmission gate and a fourth inverter, the third inverter and the fourth inverter to form a second feedback loop.

4. The error-detection circuit of claim 1, further comprising a pair of inverters coupled in series to the output of the gate, the pair of inverters to pulse-shape the error signal.

5. The error-detection circuit of claim 1, the master latch further comprising:
a first inverter to receive the first signal and to generate the second signal, the first inverter having a first input and a first output; and
a second inverter coupled to the first inverter, the second inverter having a second input and a second output, wherein the second output is coupled to the first input and the second input is coupled to the first output.

6. The error-detection circuit of claim 5, the slave latch further comprising:
a third inverter to receive the second signal and to generate the third signal, the third inverter having a third input and a third output; and
a fourth inverter coupled to the third inverter, the fourth inverter having a fourth input and a fourth output, wherein the fourth output is coupled to the third input and the fourth input is coupled to the third output.

7. The error-detection circuit of claim 1, wherein the error signal is a pulse of a variable width.

8. The error-detection circuit of claim 7, further comprising:
an error latching circuit to convert the pulse signal of a variable width to a continuous signal.

9. The error-detection circuit of claim 1, wherein the gate is an exclusive-OR gate.

* * * * *